United States Patent
Russell

[19]

[11] Patent Number: 5,887,001
[45] Date of Patent: Mar. 23, 1999

[54] BOUNDARY SCAN ARCHITECTURE ANALOG EXTENSION WITH DIRECT CONNECTIONS

[75] Inventor: Robert J. Russell, South Boston, Mass.

[73] Assignee: Bull HN Information Systems Inc., Billerica, Mass.

[21] Appl. No.: 946,952

[22] Filed: Oct. 8, 1997

Related U.S. Application Data

[63] Continuation of Ser. No. 572,252, Dec. 13, 1995, abandoned.

[51] Int. Cl.$^6$ .................................................... G01R 31/28
[52] U.S. Cl. ............................................................ 371/22.31
[58] Field of Search ................................ 371/22.31, 22.1, 371/22.5, 22.6; 364/579

[56] References Cited

U.S. PATENT DOCUMENTS

| | | | |
|---|---|---|---|
| 4,701,870 | 10/1987 | Mogi et al. | 364/580 |
| 4,922,492 | 5/1990 | Fasang et al. | 371/22.1 |
| 5,130,988 | 7/1992 | Wilcox et al. | 371/22.3 |
| 5,285,152 | 2/1994 | Hunter | 324/158 R |
| 5,390,191 | 2/1995 | Shiono et al. | 371/22.3 |
| 5,404,358 | 4/1995 | Russell | 371/22.3 |
| 5,497,378 | 3/1996 | Amini et al. | 371/22.3 |

*Primary Examiner*—Hoa T. Nguyen
*Attorney, Agent, or Firm*—Faith F. Driscoll; John S. Solakian

[57] ABSTRACT

A method and apparatus provides an analog mode of operation of a standard test access bus interface based on a standard boundary scan architecture which is limited to use of digital signals. Circuits are included in the interface which enable the sharing of control paths at separate time intervals defined under instruction control for processing analog and digital signals thereby providing a hybrid capability without any increase in the number of lines required by the interface.

21 Claims, 9 Drawing Sheets

BOUNDARY SCAN ARCHITECTURE ANALOG EXTENSION WITH DIRECT CONNECTIONS

This application is a continuation of application Ser. No. 08/572,252, filed Dec. 13, 1995, now abandoned.

RELATED PATENTS

1. U.S. Pat. No. 5,404,358 entitled, "Boundary Scan Architecture Analod Extension" invented by Robert J. Russell which is assigned to the same assignee as this patent application.

2. U.S. Pat. No. 5,448,576 entitled, "Boundary Scan Architecture Extension" invented by Robert J. Russell which is assigned to the same assignee as this patent application.

BACKGROUND OF THE INVENTION

1. Field of Use

The present invention relates to electronic integrated circuits (ICs) and, more particularly, to circuits which employ a standard boundary scan test access port.

2. Prior Art

A standard boundary scan test architecture was approved by the American National Standards Institute (ANSI) and the Institute of Electrical and Electronics Engineers (IEEE) in 1990. Major revisions were approved in 1993 and 1994 as part of an ongoing evolutionary process. This architecture provides a means by which ICs may be designed in a standard fashion such that they or their external connections, or both, may be tested using a four or five wire interface.

The roots of boundary scan testing are found in the scan test methodology developed in the 1960s. An example of one implementation of this technology is described in U.S. Pat. No. 3,582,902, granted Jun. 1, 1971. The basic scan concept is to join all storage elements (e.g., flip-flops) of a logic design in one or more serial strings. The serial, or shift register, interconnection is in addition to the normal functional interconnection, and is intended to be primarily used during testing. Although this hardly makes the testing of complex systems easy to accomplish, scanning reduces the overwhelming chore of simulating sequential systems to the more manageable chore of simulating combinatorial systems.

It is important to note that the addition of scan circuitry does not benefit the functional role of the logic system to which it is added. Test circuitry is deemed undesirable overhead which would not be included if there were other practical ways of eliminating faults. Therefore, test simplification is a powerful economic incentive.

The complexities which arise from the use of the basic scan concept were the motivation behind the development of the boundary scan test architecture. Developing a test for a design using the original scan concept required simulating large sections of a system, or an entire system. During diagnosis, failing tests often could not be readily correlated with actual faults. The reason was that any one error indication sensed at the test system could be the result of one or more of a large number of faulty devices or interconnects, even when it was assumed that the integrity of the scan string was intact (i.e., provided a fault free path).

In the boundary scan test architecture, a serial string is placed at the periphery of the IC, independent of storage element locations. A four or five wire interface between the various ICs of a system so designed to include the boundary scan test architecture in conjunction with a test system allows separate and isolated testing of the ICs and the connections between them. The end result provides a much simplified correlation between failing tests and physical faults.

Until recently, scan testing has been regarded as purely digital. While methods have been proposed to test analog devices in conjunction with digital scan testing, they often share the approach of converting analog signal levels to digital signal levels and vice-versa as part of the interface between the test system and the analog devices to be tested. Where such conversion must be avoided, separate interconnections from the digital serial string are made between the test system and the analog devices to be tested. In this case, the digital serial string serves merely as part of a routing control mechanism for the analog signals.

Although the ability to accomplish analog testing with the same overhead test circuitry as used for digital testing is most desirable, until now implementing such an arrangement has been generally viewed as impractical. For example, separate IEEE working groups are developing different digital and analog test bus standards. It is generally the view in the testing field that in-circuit testers will not be replaced regardless of strides made in boundary scan testing because analog device testing is beyond the reach of the standard boundary scan architecture. Position papers presented at the 1992 IEEE International Test Conference in conjunction with a panel on mixed signal testing (proceedings pp. 555–557) indicate separate package pins might be used in an analog test architecture for analog test purposes, in addition to the pins used in the boundary scan architecture. Presently, a standard founded in this architecture is being considered by the IEEE P1149.4 Working Group.

Significant benefit would be derived if were it possible to test analog devices utilizing the four or five package pin overhead test circuitry already largely found acceptable in the industry used to accomplish digital testing via boundary scan. This could often eliminate the need for in-circuit test stations in manufacturing. Also, this could often avoid the use of test points to accommodate such analog testing in printed circuit board designs involving optimum miniaturization. Furthermore, this could allow for analog testing at the internal IC device level.

Previously, U.S. Pat. No. 5,404,358 supported such analog testing but had the disadvantage of making connection to the analog points to be measured through other devices comprising the boundary scan chain in what might be termed an indirect connection method. The connections were made through a series of analog switches—one or more for each IC device between the end of the boundary scan chain and the point to which connection was desired. The resistance of the series of analog switches limits practical application of this technique. The method using extra pins has no such disadvantage.

Recently, another architecture has been proposed wherein the digital test mode select (TMS) input pin of the TAP serves as a mixed-signal pin and is used for stimulus during analog measurements and for logic input during control of the state transitions of the TAP's finite-state machine (TAP controller). The architecture is proposed for use in architectures having two analog buses AB1 and AB2 with identical switching networks for each I/O pin. When so used, this architecture requires one less test pin per IC by providing a common pin TMS/AB1 used for causing TAP controller state transitions and analog signals. To carry out such analog measurements with the architecture, it is required that the TAP test clock (TCK) input pin be stopped or frozen at zero.

While the above architecture reduces the number of input pins, it still requires an additional pin per each IC device for carrying out analog testing. Also, it requires that the test clock input pin be held in a single state. That is, proper operation of the architecture is dependent upon that pin. It cannot be used for other purposes, such as becoming another analog signal pin.

For a further more detailed discussion of the above architecture, reference may be made to paper 25.2 entitled, "Integration of EEEE Std. 1149.1 and Mixed-Signal Test Architectures" by David J. Cheek and R. Dandapani, published in the International Test Conference Proceedings, Copyrighted© 1995.

Accordingly, it is a primary object of the present invention to provide a method and apparatus for analog and digital signal processing by an interface generally compatible with a standard boundary scan architecture.

It is a further object of the present invention to provide a method and means of testing analog components and devices utilizing such interface in conjunction with current digital scanning techniques.

It is a still further object of the present invention to provide the method and means for an analog interface which has no significant detriment to the digital scanning techniques already in place.

It is an even still further object of the present invention to allow direct connection between an IC device within a series of IC devices of a boundary scan chain and analog measurement equipment external to the IC devices.

SUMMARY OF THE INVENTION

The above objects and advantages of the present invention are achieved in a preferred embodiment of a boundary scan interface included in an IC device which provides electronic access to circuits within the IC device. These circuits in turn provide access by circuits which externally connect to the IC device. According to the present invention, the interface is extended by including analog test circuits in the interface which share the same control pins normally used exclusively for transmitting digital signals. The sharing of such pins is accomplished by means of time allocation.

During certain time intervals, the control pins and associated circuits are used for passing digital signals. At other times, the same pins and other circuits are used to pass analog signals. Sharing is controlled by digital test circuitry internal to the IC. Such circuits are activated in response to instructions applied during previous time intervals via control and data pins of the interface and to the data input pin during the analog phase.

The interface of each IC device compatible with the standard is required to be initialized to a reset state upon power up or when an interface test reset signal (TRST*) is activated. In the present invention, the digital test circuitry becomes activated at this point and the analog test circuits are disabled. The digital test circuitry continues to operate in the same manner as a standard digital boundary scan interface until all required data including instructions in preparation for analog activity have been passed. Data is passed to and from the IC device via interface test data in (TDI) and test data out (TDO) signal pins. Control of passing the data is achieved through an interface test mode select (TMS) signal pin in conjunction with signal TCK and signals from a state machine internal to each boundary scan IC interface.

In the preferred embodiment, preparation for analog activity is done in two phases. First, data is loaded into an analog control register included in the interface. Second, an instruction is loaded into an instruction register with the interface, specifying an analog mode of operation. The instruction when decoded activates the analog mode of operation.

In the preferred embodiment, the analog control register is constructed like a digital register. Data bits are shifted into the analog control register as they would be shifted into any digital register of the interface. An some implementations, a digital test register, already included as part of the boundary scan interface, may be used to serve a dual role by having such register store the bits that otherwise would have been allocated to be stored in a separate analog control register.

Once the analog control bits have been stored in the analog control register, the data bits of an analog execute instruction are loaded into the instruction register when the appropriate state of the state machine is established by means of signals TCK and TMS (assuming TRST* is not asserted). The state machine is further made to progress to a state known as Shift-DR, wherein data register bits are shifed along the presently selected data register and between IC devices by means of the TDO to TDI connection required by the standard. The analog instruction and state machine state upon being decoded activates the analog test circuits under further control of the bits previously loaded into the analog control register. The data register selected by the analog execute instruction is a direct (buffered but asynchronous) connection path between TDI and TDO. This direct connection register structure is the same as that structure described in related U.S. Pat. No. 5,448,576.

In the preferred embodiment, bits of the analog control register selectively enable a number of analog switches included within the analog test circuits which connect to a number of test and control points within the IC device. Stated differently, these bits are used to define the connect and disconnect states of the analog switches. Further control of the analog test circuits is made by means of a stepping circuit included with the digital control section.

Signal levels on the TDI, TDO and TRST* interface pins remain digital at all times. Pins TCK and TMS assume digital levels except when analog instructions are active, at which times either or both signals may assume analog signal levels. Once an analog instruction is decoded and the state machine is in the Shift-DR state, TCK and TMS operate in the analog mode until the stepping circuit causes TCK and TMS to be reconnected to the digital controller.

When TCK and TMS are being operated in the analog mode, the analog switches within the IC device connect analog measurement circuits of a tester, usually external to a printed circuit board or system containing a string of similarly constructed IC devices to select the points to be controlled (i.e., by applying voltage/current) or to be measured. In the preferred embodiment, the analog measurements are made by connecting the tester to pins TCK and TMS, both of which are connected to all devices of the IC string or strings and to system ground. A separate power pin (TPWR) for powering the interface provides the capability of measuring analog components with no power applied to functional system circuitry.

DESCRIPTION OF THE PREFERRED EMBODIMENT

Figure 1:
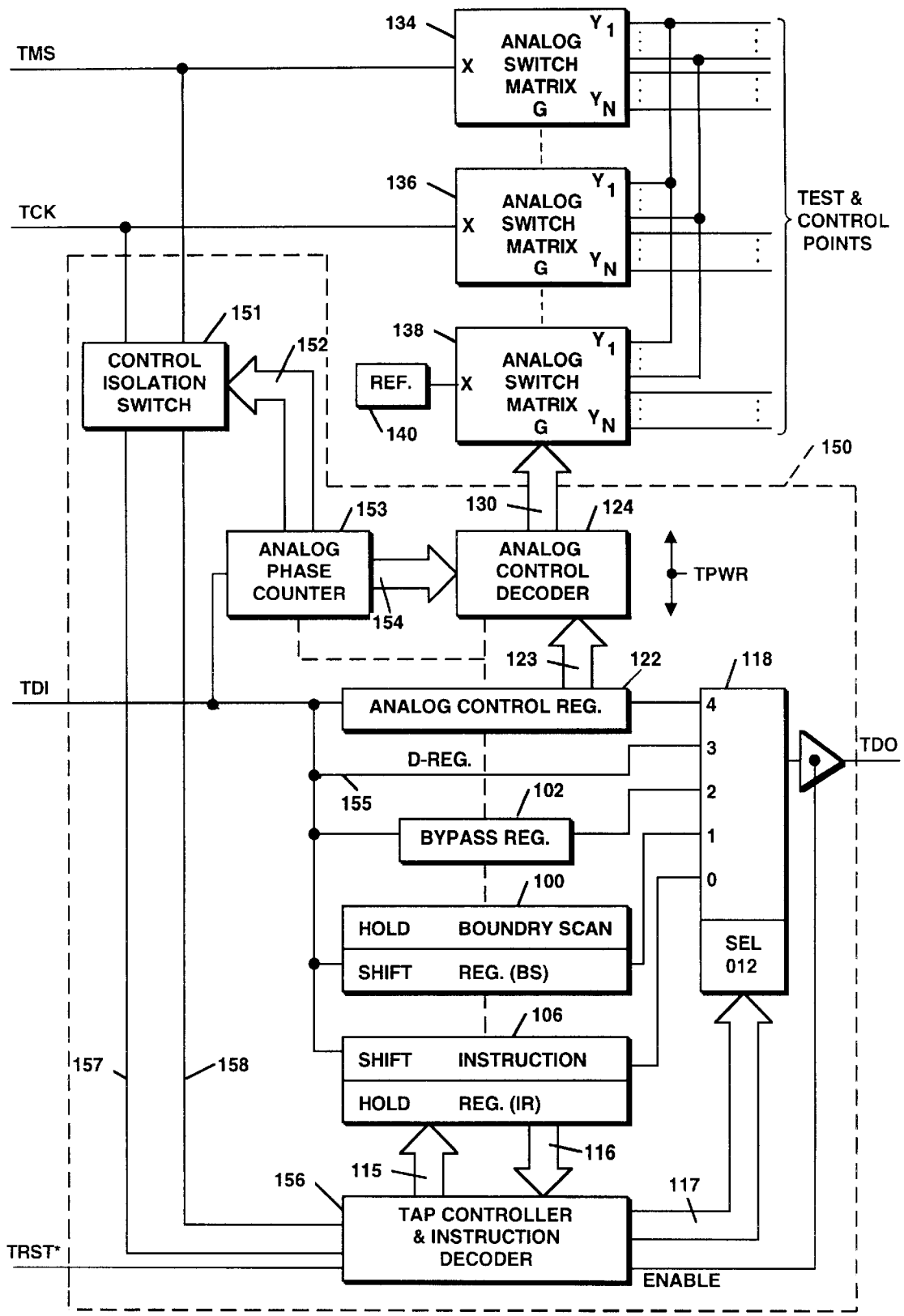
FIG. 1 is a block diagram of a hybrid test system of the present invention showing both the analog and digital sections.

FIG. 1 shows standard test access port (TAP) which implements boundary scan testing altered to incorporate the analog test circuits of the present invention. As discussed herein, a substantial portion of the circuits in FIG. I included in a digital control section such as block 150 corresponds to the circuits described in the EEE boundary scan test architecture standard.

The interface circuits of FIG. 1 provide two modes of operation: analog and digital. In the analog mode, analog signals or levels may be transmitted between circuitry external to an IC device containing the present invention and analog circuitry within the IC or within other ICs containing the interface circuits of the present invention. These circuits operate essentially in the same manner as standard boundary scan compatible units, where the TCK and TMS pins are connected to circuitry intended to transmit or receive only digital information.

The analog circuits of the present invention include a control isolation switch 151 and analog switch matrices 134, 136 and 138 connected as shown. Control isolation switch 151 is used to prevent interference by the digital circuitry of block 150 during analog measurements. For the purposes of the present invention, switch 151 contains analog switches which are standard circuits which have a control input (designated here as G) which electronically connects or disconnects a path between two terminals (designated here as X and Y). Such circuits are commonly used in commercially available ICs. An example of such a circuit is analog switch circuit designated as MC74HC4066, manufactured by Motorola, Inc. and described in the High-Speed CMOS Logic Data manual DL129 Rev. 4 dated 1989. A nominal resistance of 100 ohms is the typical resistance between the X and Y points in the connect state for such device, although the resistance value for analog switches in general has been noted to decrease with improvements in technology. Isolation resistances greater than a megohm are typical for analog switches in the disconnect state. The G input is a digital control point wherein a voltage corresponding to a logic one establishes the connect state, and a voltage corresponding to a logic zero, establishes the disconnect state. These analog switches can be omitted by designing the circuitry within switch 151 connected to pins TCK and TMS so as to provide such isolation and by eliminating the effects of a pull-up resistor connected to TMS and required as part of the standard interface by various known techniques.

The analog switch matrices 134, 136 and 138 are groups of analog switches for connecting pins TCK and TMS, and internal IC device reference points to test and control points within the IC device, separately or together, as desired. In the preferred embodiment, each system functional input and output pin of the IC device (not shown) is connected to each of the three matrices 134, 136 and 138. The selection of particular pin or internal point connections is a matter of design choice. In the preferred embodiment, matrix 138 is connected to IC ground reference voltage, represented as reference point 140. Other reference voltage points and additional switch matrices may be utilized as a matter of design choice.

For clarity, matrices 134, 136 and 138 are shown as separate physical elements with a single X point, numerous Y points and a single set of G points. In the preferred embodiment, each matrix consists of a set of individual analog switches with its individual G control inputs connected to an analog control decoder 124 via one of the set of control lines 130. The selection of a particular matrix implementation is a matter of design preference as long as the proper matrix functionality is preserved.

Analog control decoder 124 drives the various analog switch control gate inputs G over the set of lines 130 as a function of the contents previously loaded into an analog control register 122 which is connected to decoder 124 via lines 123, signals from an analog phase counter 153 applied over lines 154 and state signals from the TAP controller and instruction decoder 156 applied over lines 115. As to the latter, a signal representative of the TAP controller Shift-DR state is utilized.

TPWR is a separate power input to the circuitry of FIG. 1 which allows selected test operations to be conducted when system functional circuits are powered down. The inclusion of separate power capability is an optional part of the preferred embodiment of the present invention. This capability is unnecessary when only powered up conditions of the system circuits are to be monitored or controlled.

A direct asynchronous connection is provided between TDI and TDO by means of direct connection line 155, termed the D-register. TAP controller and instruction decoder 156 is designed such that multiplexer 118 selects this path by means of lines 117 connected to the select inputs of 118.

The circuitry of block 150 contains certain features and characteristics that would not be included were the present invention not part of the IC device. These features and characteristics are discussed below where appropriate.

In the standard boundary scan architecture, there are three digital shift registers in the TDI to TDO data path. These are instruction register 106, bypass register 102 and boundary scan register 100. The first register 106 provides a means for shifting and holding both standard and optional instructions transmitted over the TDI to TDO path from outside the IC. Shifting means and holding means are separate parts of the register. The second register 102 provides a means of passing data intended for or passed from other ICs connected to pin TDI or pin TDO in a single shift step. The third register 100 provides a drive or receive data path to the system functional digital signal pins of the IC. In the preferred embodiment of the present invention, block 150 includes an analog control register 122 which can be an optional fourth register of the standard boundary scan architecture. It is constructed in the same manner as a standard shift register. Bits held in analog control register 122 drive analog control decoder 124 via lines 123. Line 155 may be considered as an optional fifth register.

Driver 120 completes the TDI to TDO path of section 150 of FIG. 1. Multiplexer 118 selects the digital register to be used in the TDI to TDO data path according to signals representative of the contents of the instruction register 106 and state of TAP controller and instruction decoder 156 which are applied via lines 117. Driver 120 passes data received from multiplexer 118 when enabled by TAP controller and instruction decoder 156 via an enable line, as shown.

The instruction register 106 drives sections of the TAP controller and instruction decoder 156 via lines 116. Signals applied to lines 115 from the TAP controller and instruction decoder 156, are used to control the digital registers and analog decoder 124 and analog phase counter 154. Also, TAP controller and instruction decoder 156 receives signals TCK, TMS and TRST* as inputs, the same signals as standard boundary scan architecture devices not containing circuitry of the present invention.

It will be appreciated by those skilled in the art that the instruction decoder is implemented such that the decoding of an analog instruction does not by itself interfere with normal system functional operation (e.g. does not produce glitches at signal pins). This requirement is the same as the requirement established for certain digital instructions defined in the previously referenced boundary scan standard.

DETAILED DESCRIPTION OF CIRCUITS OF FIG. 1

Figure 5:
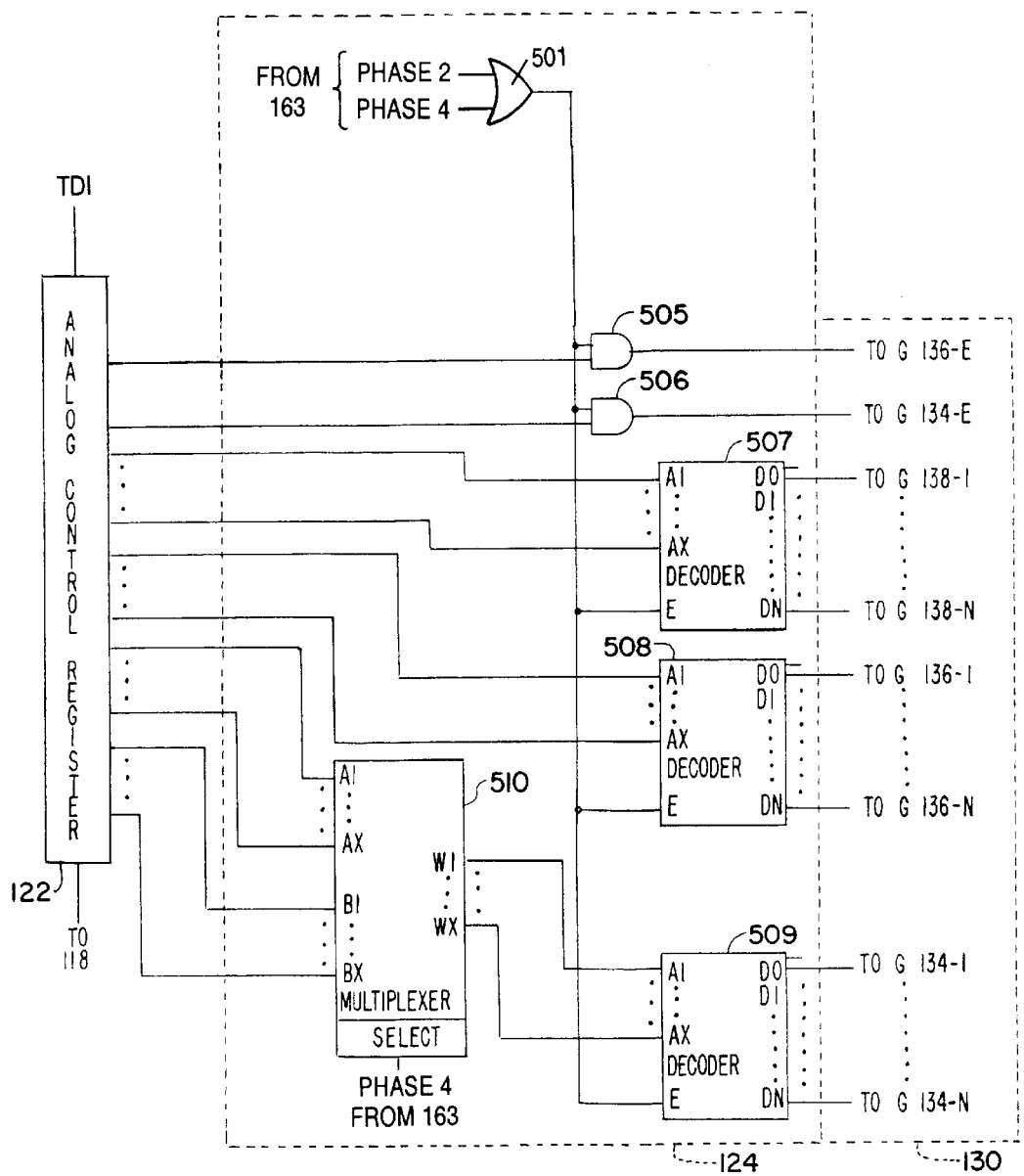
FIG. 5 shows in greater detail, the analog control decoder of FIG. 1.

FIGS. 5 through 9 disclose in greater detail, different aspects of the system of FIG. 1. FIG. 5 shows the analog control decoder 124 in greater detail. Analog control register 122 contains sufficient bits for each analog switch to be controlled, including the analog switches of the switch matrices 134, 136 and 138. In the preferred embodiment, two bits are used to individually control the analog switches of each of the matrices 134 and 136 connected to pin TCK or pin TMS. These two control points are shown as the G inputs of analog switches 601 and 602 in FIG. 6. Four additional sets of bits within analog control register 122 select one of the points (one of N) previously chosen to test or control. Each set of bits contains a number of bits such that two raised to the power of that number is equal to or greater than the number of test points plus one (N+1). For example, four sets of six bits would be used to control 63 test points.

An OR gate 501 of FIG. 5 provides the primary gating function for the analog switches and switching matrices (i.e., configures switches and matrices). This gate generates a logic one output signal when an analog execute instruction has been invoked and the analog phase counter 153 has progressed to either PHASE 2 or 4. The first two bits of analog control register (those closest to pin TDI) connect as inputs to gates 505 and 506. When the TAP controller and instruction decoder 156 is in the reset state, the output of OR gate 501 is forced to a logic zero voltage level (i.e., both signals PHASE2 and PHASE4 are at logic zero voltage levels at this time). AND gates 505 and 506 cause a logic zero level to be applied to the G inputs of analog switches 136-E and 134-E of FIG. 6, placing them in the disconnect state. Decoders 507 through 509 operate such that all outputs are zero when the E-input is at a logic zero voltage level. Thus, all analog switch matrix G inputs will be at a logic zero voltage level placing all matrix switches in the disconnect state. Therefore, when TAP controller and instruction decoder 156 are in the reset state, all analog test and control points are disconnected.

When either input signal PHASE2 or PHASE4 is a logic one level, gates 505 and 506 are individually controlled by the first two bits of analog control register 122. At the same time, the third bit of register 122 and those following bits that are connected to the binary weighted inputs of decoder 507 (A1 through AX) cause one of the decoder outputs (D0 through DX) to be forced to a logic one level, placing one of the analog switches of matrix 138 in the connect state except for output D0 when no analog switch is selected (i.e., D0 is unconnected). The next group of bits of analog control register 122 having the same number as those connected to the inputs of decoder 507 are similarly connected to decoder 508 whose outputs are similarly connected to matrix 136.

The next two groups of bits of analog control register 122 contain the same number of bits as the previous two groups. The first group of bits connects in order to inputs A1 through AX of multiplexer 510. The second group of bits connects in order to inputs B1 through BX of the same multiplexer 510. Signal PHASE4 is connected to the select input of multiplexer 510. When signal PHASE4 is at a logic zero voltage level, it forces outputs W1 through WX to the respective values applied to inputs A1 through AX. This would be the case when signal PHASE2 was active, since PHASE2 and PHASE4 are both outputs of decoder 163 in FIG. 8. When signal PHASE4 is at a logic one voltage level, outputs W1 through WX of multiplexer 510 have the same values as those present at inputs B1 through BX. Decoder 509 inputs A1 through AX are connected to respective ones of the outputs W1 through WX of multiplexer 510. The outputs W1 through WX are in turn applied to the G inputs of matrix 134.

Thus, matrix 134 switches are gated in a manner similar to matrices 138 and 136, but from either of two sets of bits of analog control register 122, the set in use being determined by the state of logic level of signal PHASE4.

Figure 6:
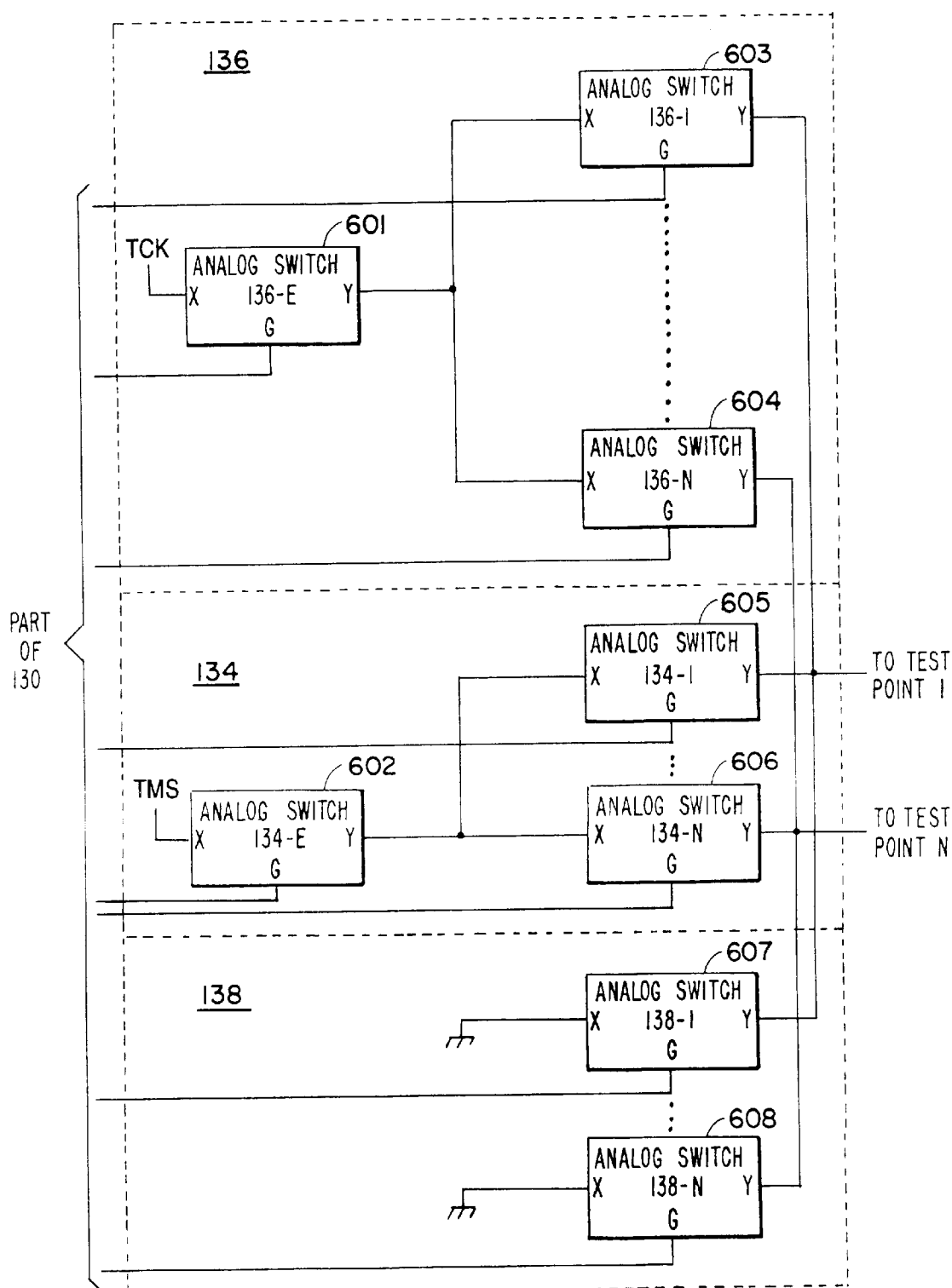
FIG. 6 shows in greater detail, the analog switch matrices of FIG. 1.

FIG. 6 shows in greater detail, connections to the analog switches of matrices 134, 136 and 138 relative to a single test point N. As shown, the single test point, N, is connected to each of the three analog switch matrices 134, 136 and 138 through the corresponding analog switch of each matrix, namely switches 134-N, 136-N and 138-N. Individual analog switches 136-1 through 136-N are connected together at their X terminals to form a bus which is connected to the Y terminal of an analog switch 136-E. This switch provides a further level of isolation between pin TCK and analog switches 136-1 through 136-N when they are all in the disconnect state.

As indicated in FIG. 6, analog switches 134-1 through 134-N and 134-E are similarly connected. The X terminal of each analog switch of analog matrix 138 is connected to IC internal ground potential. As indicated, there is no analog switch in matrix 138 corresponding to 134-E or 136-E. The G terminals of all of the analog switches of FIG. 6 connect to corresponding decoder outputs of FIG. 5.

Figure 7:
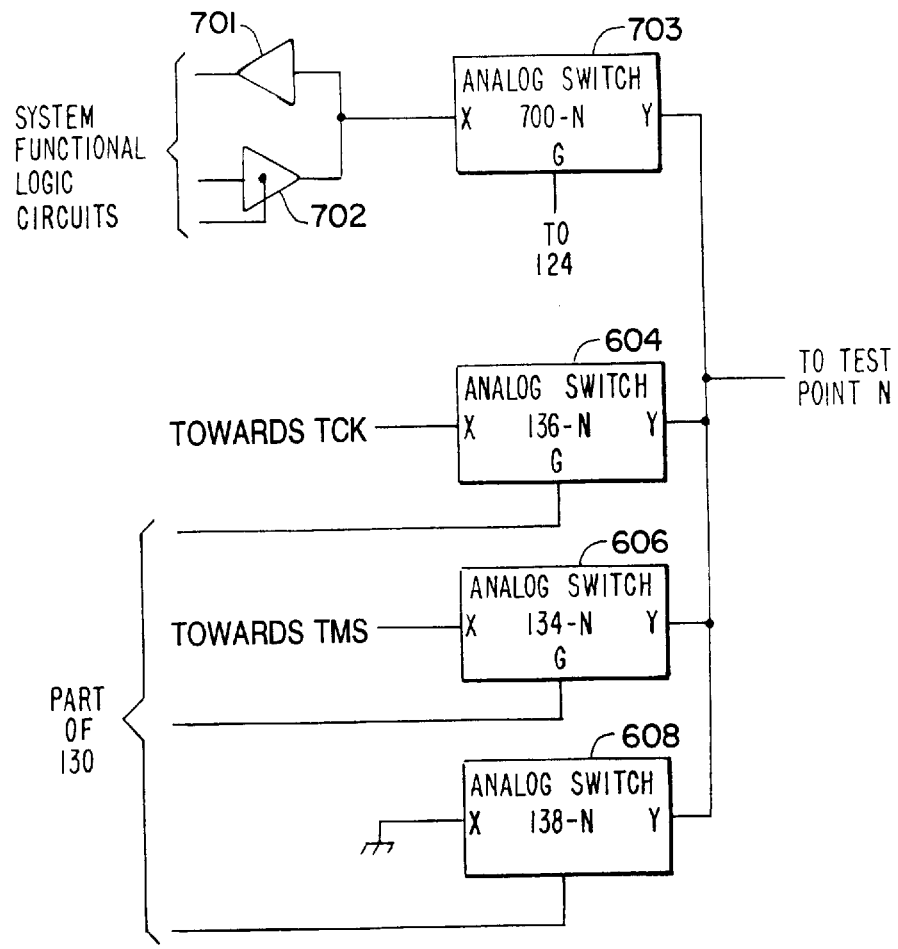
FIG. 7 shows the connections at a test point between the analog switch matrices and system functional circuits.

FIG. 7 illustrates representative connections between the functional system circuitry at a test point N, such as external connection point or pin, and analog switches of analog switch matrices 134, 136 and 138. A receiver circuit 701 and a driver circuit 702 provide the interface to the IC system functional logic circuits. In the preferred embodiment, the driver and receiver circuits 701 and 702 would also connect directly to the test point N and to the Y terminals of corresponding ones of analog switches 134-N, 136-N and 138-N. These analog switches are designated as 604 through 606 in FIG. 7. For purposes of isolation, another analog switch 703 can be connected between the driver and receiver circuits 701 and 702 and test point N. This switch would be part of another analog switch matrix 700 (i.e., 700-N) and which would be controlled by additional bits of analog control register 122 and additional decode logic circuits. This analog switch 703 would provide a means of isolating certain system functional circuits from other such circuits such that analog measurements otherwise only possible with system power off could now be made with system power on. This would eliminate the need to provide the separate power pin TPWR.

Figure 8:
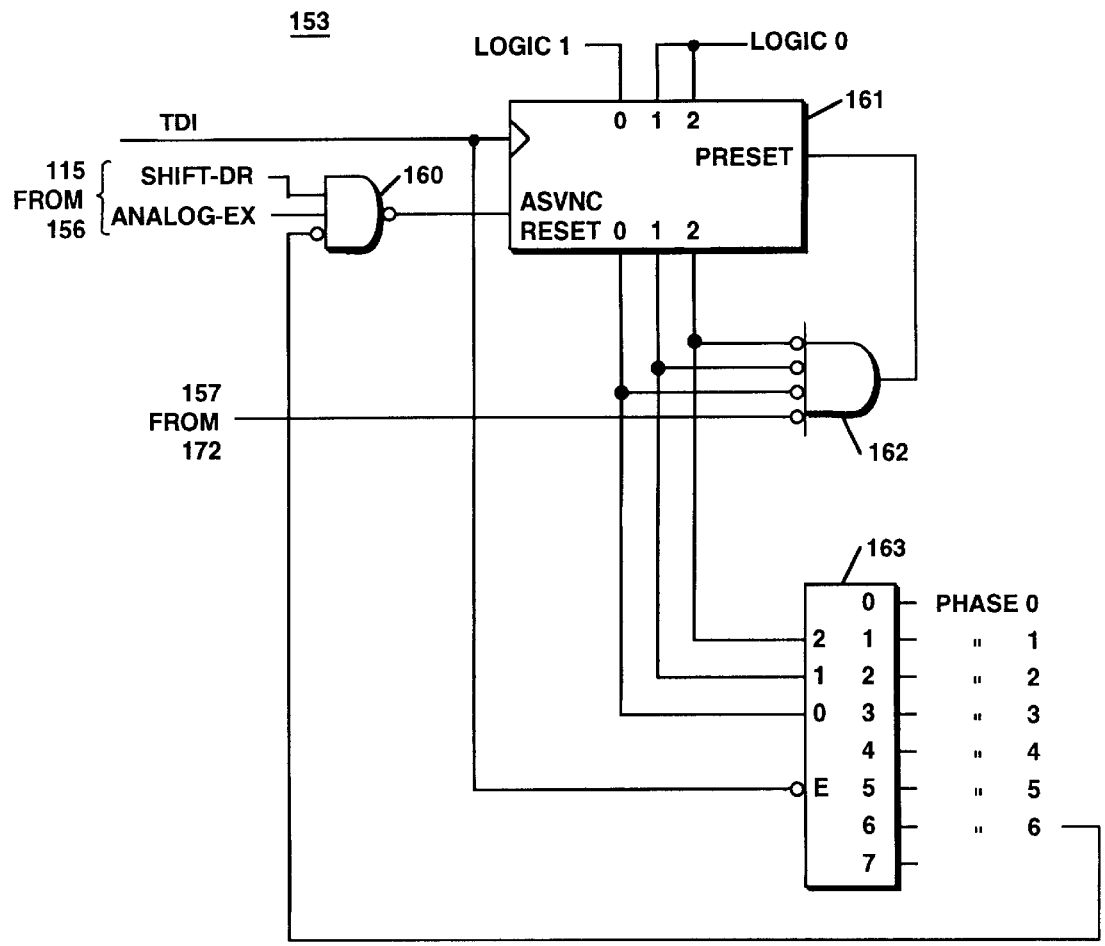
FIG. 8 shows the analog step circuitry in greater detail.

FIG. 8 shows details of analog phase counter 153. As shown, counter 153 includes a 3-bit binary counter 161 having input and output gates 160 and 162, in addition to an output 3:8 decoder 163. The counter 161 is reset to a ZERO state (all logic zero voltage level outputs) when the output of gate 160 is a logic one. Input state signals SHIFT-DR and ANALOG-EX from TAP controller and instruction decoder 156 will be logic zero except when an analog execute instruction is held in the instruction register and the TAP controller state is Shift-DR. Counter 161 will, therefore be reset at the beginning of an analog execute instruction operation. Counter 161 is designed such that other inputs are ignored when the reset input is a logic one voltage level. Gate 162 activates the preset input of counter 161 when the counter is at a zero count and TCK is a logic zero voltage level. Assuming gate 160 is at logic zero voltage level, as during the Shift-DR state in the case of an analog execute instruction, counter 161 will be preset to a count of one at that time. Decoder 163 operates such that all outputs are at a logic zero voltage level except when the E input connected to TDI is logic zero voltage level, at which time the output corresponding to the value of the inputs from counter 161 will become a logic one voltage level (e.g., a value of 010 on the inputs causes counter PHASE2 output to become logic one voltage level).

Figure 9:
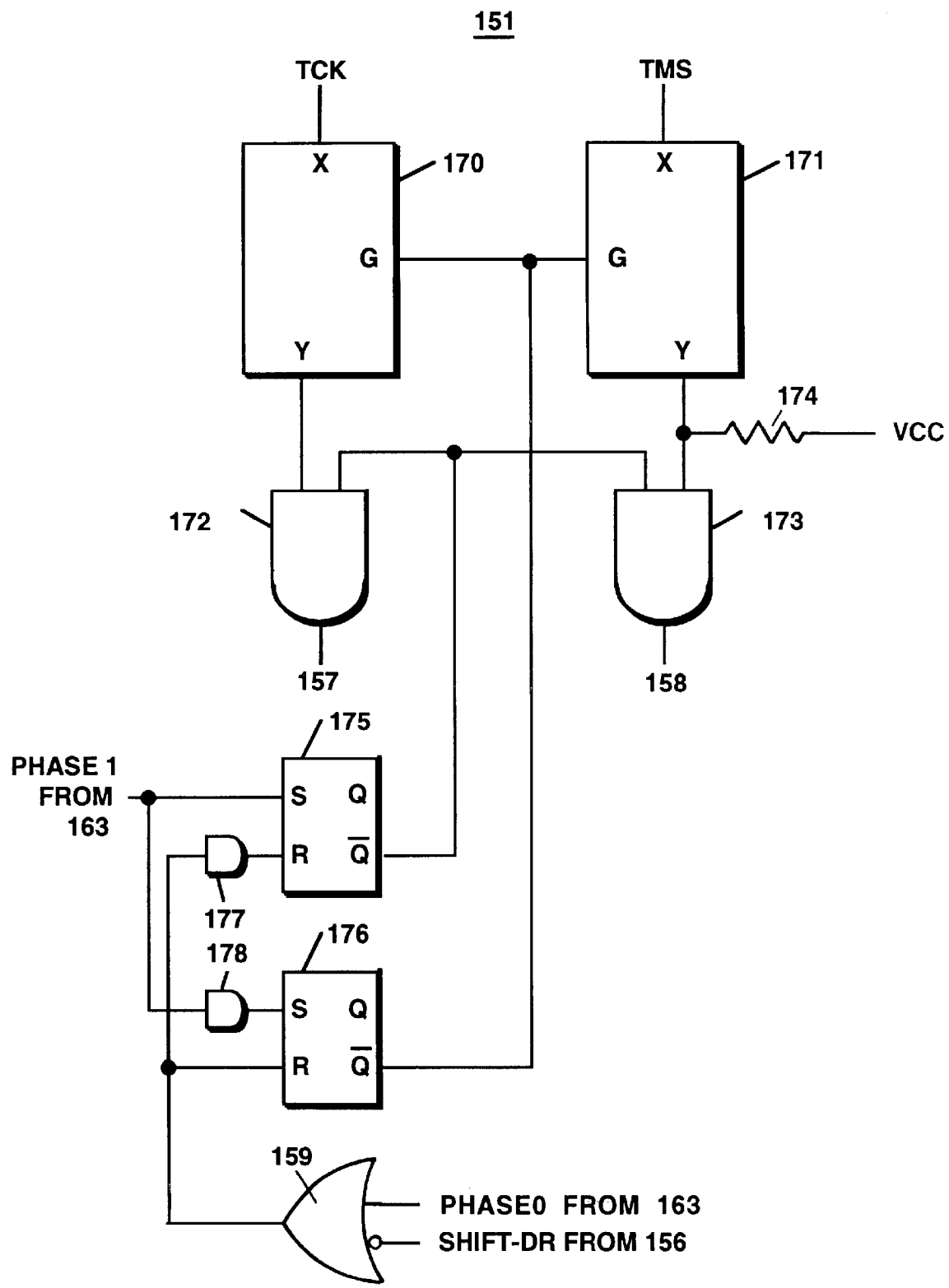
FIG. 9 shows the circuitry used to isolate control signals TCK and TMS from the digital control section of FIG. 1 when analog signals are being processed.

FIG. 9 shows the control isolation switch 151 in greater detail which provides a means of disconnecting TCK and TMS from the digital control section 150. As shown, switch 151 includes a pair of analog switches 170 and 171, a pull-up resistor 174 with corresponding output AND gates 172 and 173, in addition to a pair of latches 175 and 176 having input gates 159, 177 and 178. In the preferred embodiment, lines 157 and 158 replace TCK and TMS, respectively, within digital section 150. During normal digital operations, the G inputs of analog control switches 170 and 171 and common inputs of AND gates 172 and 173 are held at logic one voltage level. Thus, line 157 will be at the same state as TCK and line 158 will be at the same state as TMS. Furthermore, pull-up resistor 174 will be connected to the TMS line through switch 171. S-R latches 175 and 176 operate such that the Q output becomes logic one voltage level when the S input is logic one voltage level and the Q-negative output becomes logic one voltage level when the R input is logic one voltage level. The Q and Q-negative outputs are opposite except when both S and R inputs are a logic one voltage level. Normal operation of the standard architecture ensures that the output of gate 159 will be logic one voltage level prior to any instruction because the state machine state will be other than in state Shift-DR, causing gate 159 SHIFT-DR input to be a logic zero voltage level and because the analog phase counter 153 will be at phase zero. The Q-negative outputs of S-R latches will, therefore, be held at the logic one voltage level state required for the normal digital connection between TCK and line 157 and TMS and line 158 plus the pull-up resistor 174. The logic one voltage level state of both 175 and 176 will be held until as long as the PHASE1 output is at logic zero voltage level. When analog execute instruction operations progress to the point where PHASE1 output becomes logic one voltage level, the Q-negative output of S-R latch 175 will become logic zero. Lines 157 and 158 will be forced to a logic zero voltage level. Buffer gate 178 is designed with adequate delay to ensure the logic one voltage level transition of the Q-negative output of 176 will occur after the Q-negative output of 175, such that glitching is prevent on lines 157 and 158. Similarly, the reverse order will be forced when the analog execution operation has been completed. PHASE1 and PHASE0 outputs will be at logic zero voltage levels. The SHIFT-DR input will be at a logic one voltage level. As the analog operation progresses, the PHASE0 output will become a logic one voltage level. TCK and TMS connections through analog control switches will be enabled as S-R latch 176 Q-negative output becomes a logic one voltage level. Buffer gate 177 will delay the enabling of gates 172 and 173 until the analog control switch activity has been completed. Operation of the external controller will ensure stable signals are present at TCK and TMS before the switch over.

DESCRIPTION OF OPERATION

With reference to FIGS. 1 through 9, the operation of the present invention will now be described.

Figure 2:
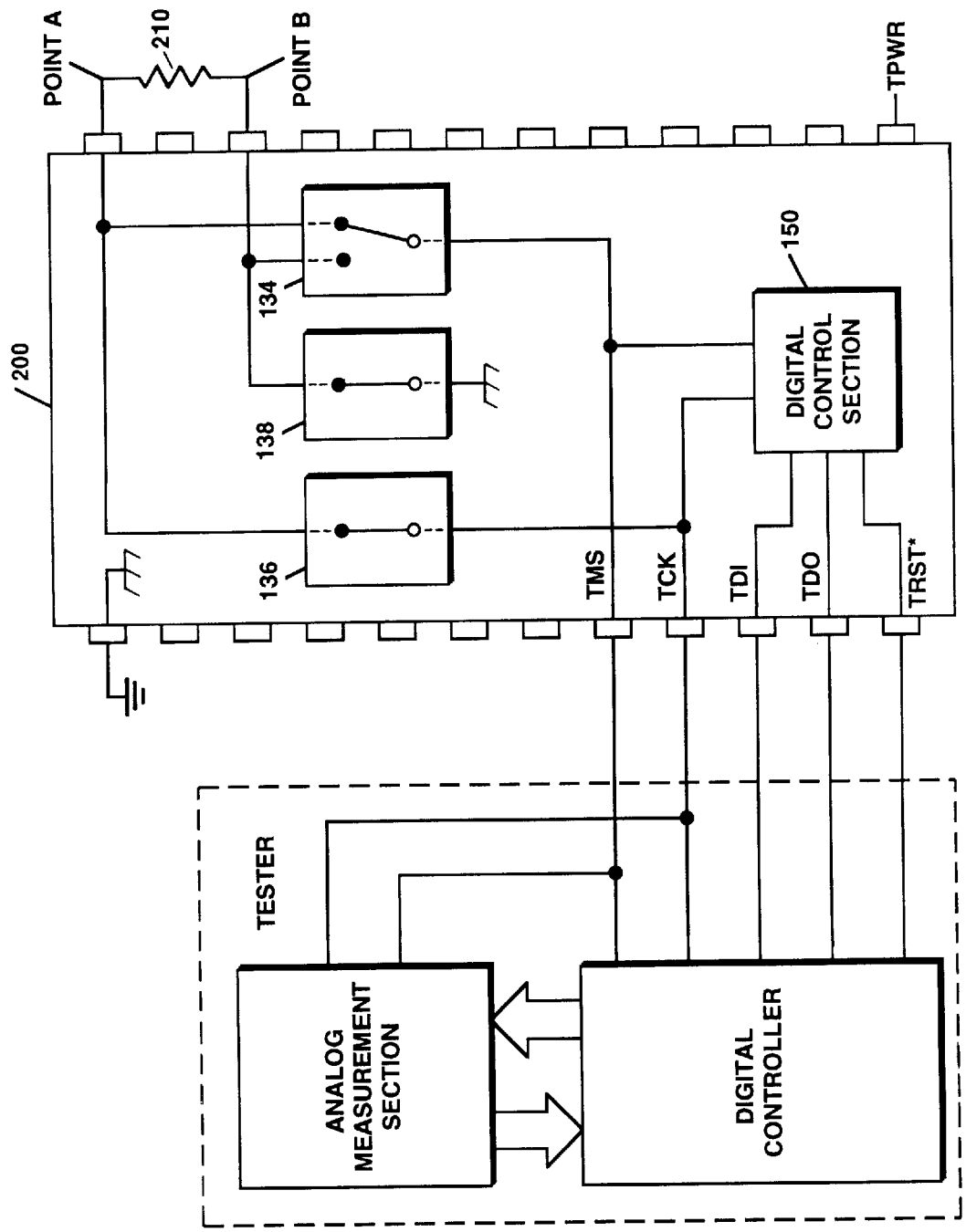
FIG. 2 shows how the analog test circuits of the present invention measures an external analog component between two pins of the same IC.
Figure 3:
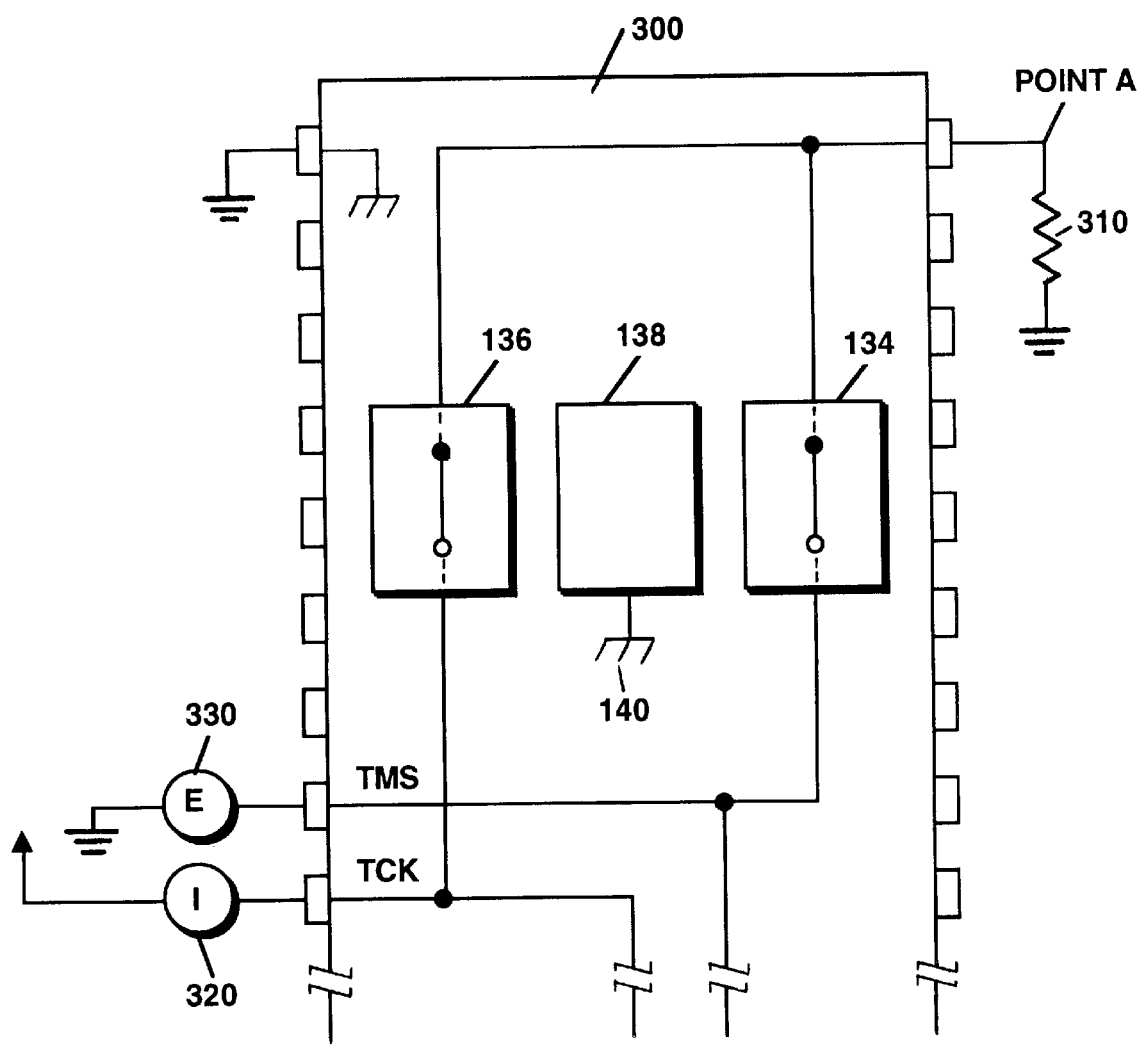
FIG. 3 shows how the analog test circuits of the present invention measures a component connected between an IC pin and ground.
Figure 4:
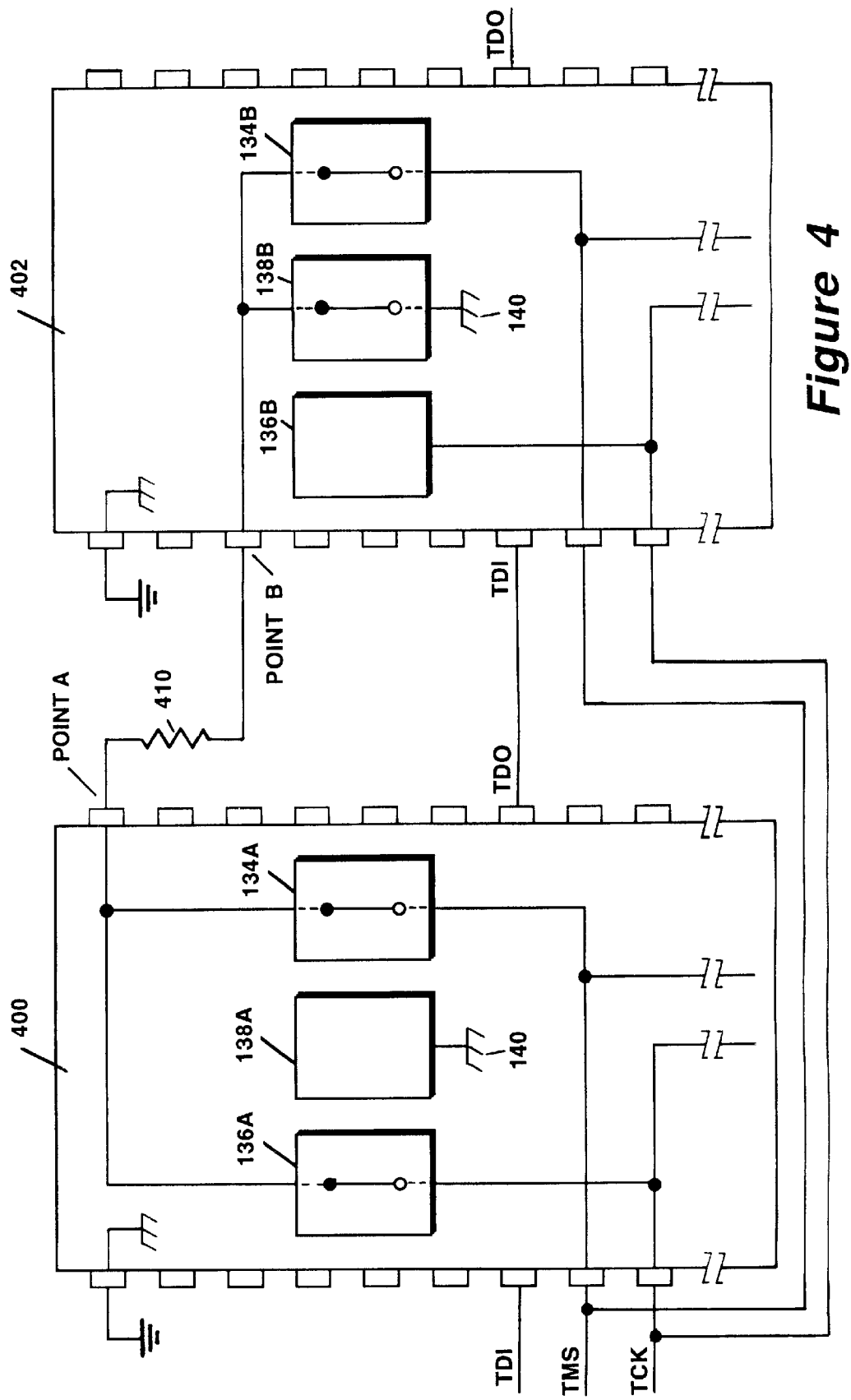
FIG. 4 shows how the analog test circuits of the present invention measure a component connected between pins of two ICs.

For illustrative purposes, in regard to FIGS. 2, 3 and 4, the establishment of connections within analog switch matrices 134, 136 and 138 are shown as dashed lines connected to schematic symbol of switches. Where one of two connections are alternatively made within the same matrix, a two-position switch is shown. To simplify explanation, the analog control register 122 (ACR), analog switch matrices 134, 136 and 138 (ASMs) and analog switches (ASWs) will be referenced by their respective abbreviations.

Description of FIG. 2

FIG. 2 illustrates measuring the value of a resistor 210 connected to two pins of an integrated circuit 200 utilizing the present invention. The resistor is shown to be external to the IC, but the measurement process would be the same were it internal. Point A and point B represent pins of IC 200 which connect to resistor 210. Testing is carried out by a testing consisting of a digital controller and analog measurement section. A tester consisting of a digital controller and analog measurement section is shown. The digital controller provides all TDI and TRST* stimulus to the integrated circuit being tested, represented by device 200. The digital controller receives signals via TDO from device 200. The digital controller also directs all stimulus and measurement operations of the analog measurement section via lines TCK and TMS, isolating itself from those two lines when analog operations are taking place.

The phases required to measure resistor 210 utilizing the present invention may be summarized as follows:
1. Disable analog measurement section—digital control of TCK and TMS.
2. Reset TAP.
3. Set ACR 122 in data path.
4. Load ACR 122 to provide the following ASM and ASW settings:
    A. ASW 134-E, 136-E=connect state
    B. ASM 136=connect state to Point A
    C. ASM 138=connect state to Point B
    D. ASM 134=connect state to Point A when PHASE4= logic zero voltage level.

E. ASM 134=connect state to Point B when PHASE4= logic one voltage level.
5. Load ANALOG EXECUTE instruction in Instruction Register.
6. Proceed to Shift-DR state, TCK=1, TDI=0.
7. Set TCK=0.
8. Isolate drivers to TCK,TMS with digital controller.
9. Clock TDI high, then low with digital controller.
10. Cause analog measurement with digital controller:
    A. Apply voltage to TCK, measure current.
    B. Measure voltage from TMS to system ground.
11. Clocks TDI twice (1,0,1,0) from digital controller.
12. Repeat step 10.
13. Calculate value of resistor R210.
14. Digital controller:
    A. Clocks TDI (1,0).
    B. Disables analog measurement section.
    C. Resumes control of TCK, TMS (both set to 0).
    D. Clocks TDI (1,0).
15. IC device 200 switches to observe TCK, TMS.
16. Digital controller continues TAP operation.

In step 1, power to the system functional circuitry may be removed and only pin TPWR utilized to apply power. Other means may be used to isolate resistor 210, such as ASWs equivalent to ASW 703 of FIG. 7. Otherwise, the effect of such power would have to be considered when later determining an acceptable deviation from the measurements made.

In step 2, the test access port is reset by applying five cycles of TCK with TMS at a logic one or by temporarily asserting TRST*, as explained previously. Also, as described previously relative to FIG. 5, the interface of device 200 is configured for digital data transfer as a result of TAP reset.

In step 3, ACR122 is selected as the data register of the TDI to TDO path. This is achieved by scanning a predetermined bit configuration into instruction register 106 by means of an instruction register (IR-LOAD) sequence defined in the boundary scan standard previously referenced. Control of TAP controller and instruction decoder 156 for register load sequences is achieved by manipulating TMS and TCK in a standard manner.

When other IC devices utilizing the present invention are connected to form extensions of the TDI to TDO path of IC200, registers equivalent to ACR122 may be selected by loading similar bit configurations in their instruction registers as part of the same IR-LOAD sequence for IC200.

In step 4, ACR122 of IC200 is loaded with the bit configuration required for use in subsequent measurements. As shown in FIG. 5, this bit configuration selects ASWs and ASMs to be in either the connected or disconnected state when the instruction register is loaded with an analog execute instruction, the TAP state machine is in the Shift-DR state and the analog phase counter is at either at PHASE2 or PHASE4. In the case of ASWs 134-1 through 134-N of ASM 134, the PHASE2 and PHASE4 outputs may cause different connect or disconnect states.

Step 4 is divided into parts 4A through 4F. In step 4A, ASWs 134-E and 136-E are set to connect other predetermined ASWs of respective ASMs to pins TMS and TCK, respectively. In step 4B, the point A ASW of ASM 136 is set to connect point A to TCK through ASW 136-E. In step 4C, point B ASW of ASM 138 is set to connect point B to ground. In step 4D, point A ASW of ASM 134 is set to connect point A to TMS through ASW 134-E when PHASE4 is at a logic zero level. In step 4E, the point B ASW of ASM 134 is set to connect point B to TMS through ASW 134-E when the PHASE4 output is at a logic one level.

In step 5, another IR-LOAD sequence of the type previously referenced in step 3 is utilized to load the bit configuration for an analog execute instruction into each IC instruction register. Devices not having points involved in an analog measurement must nevertheless become disconnected from TCK and TMS appropriately.

In step 6, the digital controller of the tester continues manipulating TCK, TMS and TDI until the TAP state machine of all IC devices connected to the boundary scan chain are in the Shift-DR state. As that state is entered, TMS is zero and TCK has transitioned from zero to one, by definition. The digital controller sets TDI to zero. The TDI to TDO path selected by the analog execute instruction is line 155. Thus, all activity in terms of state changes observed at the TDI pin of the first IC device of the boundary scan chain will ripple through to the TDO pin of the last IC device of the boundary scan chain and be available for observation by the tester.

In step 7, the digital controller sets TCK=0. At this point, gate 160 of analog phase counter 153 is no longer forcing counter 161 into a reset state, the output of gate 162 becomes logic one, and counter 161 is preset to a count of one. Control isolation switch 151 forces lines 157 and 158 to logic zero voltage level and isolates lines TCK and TMS as previously described.

In step 8, the digital controller disconnects itself from lines TCK and TMS, then, in step 9, causes the analog phase counter of all IC devices in the boundary scan chain to proceed to PHASE2 by clocking TDI.

In step 10A, the digital controller directs the analog measurement system to apply a voltage to line TCK and measure the resulting current. In step 10B, the voltage between TMS and ground is measured by another section of the analog measurement section at the direction of the digital controller. Steps 10A and 10B occur simultaneously, the result of a single command from the digital controller. The current supplied to TCK flows through ASW 136-E, the point A ASW of ASM 136, resistor 210, the point B ASW of ASM 138 and associated connections.

The analog measurement section measures the voltage at the TMS pin of IC device 200 relative to system ground. The measurement path consists of the point A ASW of ASM 134, the ASW 134-E and the TMS line.

In step 11, the digital controller clocks TDI twice, causing the analog phase counter to proceed to PHASE3 and then during PHASE4. In PHASE3, all ASM switches are disconnected. In PHASE4, some ASM 134 switches may be in a different position than PHASE2. PHASE3 is included to avoid potential problems in switching within different IC devices as TDI transitions ripple through the various devices of the boundary scan chain. In PHASE4, the same TCK line path exists through ASM 136-E, the point A ASW of ASM 136 and the point A ASW of ASM 138, but the TMS line is now connected to the point B end of resistor 210 through ASW 134-E and the point B ASW of ASM 134.

In step 12, the digital controller causes the analog measurement section to perform the same measurements made in step 10. In step 13, the value of resistor 210 is calculated from the difference in voltage and current measurements of steps 10 and 12.

In step 14A, TDI is clocked to disconnect all ASMs as the analog phase counter of all IC devices of the boundary scan chain increments to PHASE5. In step 14B, the digital controller causes the analog measurement section to disconnect from lines TCK and TMS. Neither line is now driven by the tester nor any IC device on the boundary scan chain. In step 14C, the digital controller resumes control of TCK and TMS, setting both to logic zero voltage level. In step 14D, the digital controller clocks TDI, causing the analog phase counter of all IC devices to proceed to PHASE6.

In step 15, essentially an extension of step 14D, output PHASE6 forces a reset of all counters 161, in turn causing TCK to connect through ASW 170 and gate 172 to line 157, and TMS to connect through ASW171 and gate 173 to fine 158. The TAP controller and instruction decoder 156 is then observing TCK and TMS in the normal digital mode. TMS pull-up resistor 174 is reconnected in the process.

In step 16, the digital controller proceeds from the Shift-DR state to the next desired operation.

Description of FIG. 3

FIG. 3 illustrates measuring the value of a resistor 310 connected to two pins of an integrated circuit 300 utilizing the present invention. The resistor is shown to be external to the IC, but the measurement process would be the same were it internal. Point A represents a pin of IC 300 which connects to resistor 310.

The steps required to measure resistor 310 utilizing the present invention may be summarized as follows:
1. Disable analog measurement section—digital control of TCK and TMS.
2. Reset TAP.
3. Set ACR122 in data path.
4. Load ACR122 to provide the following ASM and ASW settings:
   A. ASW 134-E, 136-E=connect state.
   B. ASM 136=connect state to Point A.
   C. ASM 138=disconnected.
   D. ASM 134=connect state to Point A when PHASE4 output=logic zero voltage level.
   E. ASM 134=connect state to Point A when PHASE4 output=logic one voltage level.
5. Load ANALOG EXECUTE instruction in Instruction Register.
6. Proceed to Shift-DR state, TCK=1, TDI=0.
7. Set TCK=0.
8. Digital controller isolates drivers to TCK,TMS.
9. Digital controller clocks TDI high, then low.
10. Digital controller causes analog measurement:
    A. Apply voltage to TCK, measure current.
    B. Measure voltage from TMS to system ground.
11. Digital controller clocks TDI twice (1,0,1,0).
12. Repeat step 10.
13. Calculate value of resistor R310.
14. Digital controller:
    A. Clocks TDI (1,0).
    B. Disables analog measurement section.
    C. Resumes control of TCK, TMS (both set to 0).
    D. Clocks TDI (1,0).
15. Device 300 switches to observe TCK, TMS.
16. Digital controller continues TAP operation.

Steps 1 through 12 and 14 through 16 relating to FIG. 3 are the same as those relating to FIG. 2. In step 13, however, the resistance calculation is made based on the voltage and current measurements of a single step (10 or 12).

Description of FIG. 4

FIG. 4 illustrates measuring the value of a resistor 410 connected to two pins of integrated circuits 400 and 402 utilizing the present invention. The resistor is shown to be external to the ICs, but the measurement process would be the same were it internal to one of them. Point A and point B represent pins of ICs 400 and 402 which connect to resistor 410.

The steps required to measure resistor 410 utilizing the present invention may be summarized as follows:
1. Disable analog measurement section—digital control of TCK and TMS.
2. Reset TAP.
3. Set ACR122 of both devices in data path. (Other devices may utilize the bypass register.)
4. Load IC 400 ACR122 to provide the following ASM and ASW settings:
   A. ASW 134-E, 136-E=connect state.
   B. ASM 136A=connect state to Point A.
   C. ASM 138A=disconnect state.
   D. ASM 134A=connect state to Point A when PHASE4 output=logic zero voltage level.
   E. ASM 134A=disconnect state when PHASE4 output= logic one voltage level.
   Load IC 400 ACR122 to provide the following ASM and ASW settings:
   F. ASW 134-E=connect state, ASW 136-E= disconnect state.
   G. ASM 136B=disconnect state.
   H. ASM 138B=connect state to Point B.
   I. ASM 134B=disconnect state when PHASE4 output=logic zero voltage level.
   J. ASM 134B=connect state to Point B when PHASE4 output=logic one voltage level.
5. Load ANALOG EXECUTE instruction in all Instruction Registers.
6. Proceed to Shift-DR state, TCK=1, TDI=0.
7. Set TCK=0.
8. Digital controller isolates drivers to TCK,TMS.
9. Digital controller clocks TDI high, then low.
10. Digital controller causes analog measurement:
    A. Apply voltage to TCK, measure current.
    B. Measure voltage from TMS to system ground.
11. Digital controller clocks TDI twice (1,0,1,0).
12. Repeat step 10.
13. Calculate value of resistor R410.
14. Digital controller:
    A. Clocks TDI (1,0).
    B. Disables analog measurement section.
    C. Resumes control of TCK, TMS (both set to 0).
    D. Clocks TDI (1,0).
15. Devices 400, 402 switch to observe TCK, TMS.
16. Digital controller continues TAP operation.

Steps 1 through 3 and 5 through 16 relating to FIG. 4 are the same as those relating to FIG. 2. Step 4 is essentially the same, except that FIG. 2 utilizes two connected states of ASM 134 within a singe device 200 in connecting the analog measurement section in making subsequent measurements of the two ends of a resistor (points A and B). In FIG. 4, step 4 utilizes ASM 134A connected in analog phase counter PHASE2 and disconnected in PHASE4 and ASM 134B disconnected in PHASE2 and connected in PHASE4 for the same purpose (i.e., making subsequent voltage measurements at the two ends of a resistor) in regard to resistor 410 connected between device 400 and device 402.

From the above, it is seen that the present invention provides the capability of extending a standard boundary scan interface for processing both analog and digital signals without additional terminals beyond the four or five terminals conventionally used while providing a direct connection for analog measurements to all ICs of a boundary scan chain.

It will be appreciated by those skilled in the art that many changes may be made to the preferred embodiment of the present invention without departing from its teachings. For example, the invention is not limited to any specific boundary scan architecture or specific instruction coding.

Also, for example, values of capacitive or inductive circuit elements may be determined by utilizing the methods described above for measuring resistive elements by substituting AC source and AC measurement means instead of the DC source and DC measurement means utilized above. Furthermore, the above apparatuses and methods may also be used to externally monitor test points within a system without interference during normal system functional operations. External controlling of test points may also be accomplished by applying the appropriate currents and voltages to such points. Still further, common parametric measurements may be made of logic elements (e.g., input threshold voltage) contained within IC devices utilizing the present invention by appropriate selection of test points.

Still further, analog switches capable of processing negative voltages may be utilized to allow measurements where such voltages are necessary. This may require the application of additional negative power to the IC device.

Still further, test circuits may be incorporated in IC devices utilizing the present invention which modify the signals at desired system functional points to fall within the constraints imposed by the technology utilized in design of the test circuits (e.g., voltage or frequency limits).

Still further, additional reference voltage other than ground may be used to benefit in measuring analog values.

Still further, the analog control register may be constructed with separate shift and hold sections to provide a means of altering matrix settings.

Still further, storage elements within the boundary scan register may be utilized in place of otherwise separate and dedicated elements of an analog control register.

Still further, the analog phase counter may be replaced with timer circuitry contained within each IC device and the controller to allow the equivalent of the same set or a minimal set of steps to take place while TDI remained at a predetermined level. This method would allow reverting back to the digital mode by means of a level observed at TDI, such as would be the case if the predetermined level for sustaining analog operations were a logic zero and the device connected to the TDI input changed from the Shift-DR state, allowing the input to be pulled to a logic one by the internal pull-up resistor required by the standard.

Still further, a device may be constructed with certain of the above described sections omitted such that it would be compatible with such devices which allowed analog measurement to be made through their TCK and TMS pins even though the particular device being constructed did not. For example, the analog matrices, analog control register and analog control decoder could be omitted from such a device.

While in accordance with the provisions and statutes there has been illustrated and described the best form of the invention, certain changes may be made without departing from the spirit of the invention as set forth in the appended claims and that in some cases, certain features of the invention may be used to advantage without a corresponding use of other features.

What is claimed is:

1. A method of extending the capability of a standard boundary scan interface of an integrated circuit (IC) to process both digital and analog signals, said interface having a digital data input (TDI) terminal, a digital data output (TDO) terminal, a test mode select (TMS) terminal, a test clock (TCK) terminal and a digital control section including a controller for defining a plurality of operational states for said interface and for generating in response to instructions applied to the interface, control signals used to control testing of circuits associated with the IC wherein the IC can be used in a system containing a number of ICs serially connected to form a boundary scan chain and said method comprising:

(a) extending the interface by connecting a control switching circuit included within the digital control section between the controller and the TMS and TCK terminals for properly configuring TMS and TCK terminals as inputs to the controller for operating the interface to pass signals in a first instance and to pass analog signals in a second instance so as to operate the interface in both digital and analog modes;

(b) next, extending the interface by connecting a phase control counter circuit included within the digital control section to the TDI terminal to receive externally generated digital control signals therefrom during analog mode of operation for sequencing the counter circuit through a number of states for producing signals defining predetermined phases of operation and to the control switching circuit for the configuring of the TMS and TCK terminals for operating the interface in either analog or digital mode according to the predetermined phases of operation;

(c) further extending the interface by connecting analog control means to the TDI terminal and to the phase control counter circuit for receiving digital control signals and the signals defining the predetermined phases of operation respectively therefrom; and, (d) connecting the analog control means to the controller of the digital control section for operating the analog control means in response to said instructions and to be responsive to a predetermined data bit pattern received by the analog control means through the TDI terminal prior to analog activity, the analog control means producing output signals to be used for enabling the transfer of analog signals through the TCK and TMS terminals of the IC for carrying out analog testing in conjunction with the extended interface during predetermined phases of operation defined by the phase control counter circuit.

2. The method of claim 1 wherein the digital control section includes a plurality of standard registers connected to the controller and a direct register circuit and wherein step (d) of said method further comprises:

(e) generating signals for connecting the TDI terminal to the TDO terminal through the direct register circuit for directly transferring digital signals applied to the TDI terminal to the TDO terminal for controlling the sequencing of phases in the IC.

3. The method of claim 2 wherein the IC further includes a number of elements and said method further includes:

(f) connecting the TMS terminal to a first number of test and control points within the circuits of the IC through first analog switching circuit means included in the analog control means for extending the interface, for establishing at least one first circuit path;

(g) connecting the TCK terminal to a second number of test and control points within the circuits through second analog switching circuit means included in the analog control means for extending the interface, for establishing at least one second circuit path;

(h) connecting decode control means included within the analog control means for extending the interface, to each of the first and second analog switching means; and, (i) the decode control means when enabled by certain bits of the predetermined data bit pattern applying enabling signals for connecting predetermined ones of the analog switching circuit means to provide first and second circuit paths to selected ones of said test and control points for passing and monitoring analog signals for testing the elements connected to the test and control points.

4. The method of claim 3 wherein the operations of step (i) are carried out during different ones of the predetermined number of phases.

5. The method of claim 3 wherein the elements connected to the test and control points are included as part of the circuits of the IC.

6. The method of claim 3 wherein said method further includes:

(j) connecting a number of voltage reference potential points to a third number of test and control points within the circuits through third analog switching circuit means included in the analog control means for extending the interface, for applying reference voltage potentials to the third number of test and control points when said interface is operating in the analog mode.

7. The method of claim 3 wherein each of said first, second and third analog switching means includes a number of analog switches and said digital control section further including a plurality of registers connected between said TDI and TDO terminals, one of said plurality of registers corresponding to an instruction register for storing said instructions applied to said interface, said method further including:

(k) connecting another one of said plurality of registers as an analog control register included within the analog control means for storing the predetermined data bit pattern loaded into said analog control register by the digital control section in response to decoding of a predetermined type of instruction; and, (l) coding said predetermined data bit pattern to specify connect and disconnect states for said number of analog switches in said first, second and third analog switching means for establishing said first and second circuit paths.

8. The method of claim 7 wherein said number of the number of analog switches in the first and second analog switching means is related to the number of test and control points and is arranged to form a matrix.

9. The method of claim 3 wherein the IC has a number of terminals used for interconnecting the IC to a further IC and wherein a number of the elements are located external to the IC and connected to the number of terminals of the IC.

10. The method of claim 1 wherein in step (b) the control switching circuit is configured in a manner which inhibits the TMS and TCK terminals from applying signals to the control state machine during the predetermined phases of operation defined by the phase counter circuit.

11. Apparatus for extending the capability of a standard boundary scan interface of an integrated circuit (IC) to process both digital and analog signals, said interface having a digital data input (TDI) terminal, a digital data output (TDO) terminal, a test mode select (TMS) terminal, a test clock (TCK) terminal and a digital control section including a controller for defining a plurality of operational states for said interface and for generating in response to instructions applied to the interface, control signals used to control testing of circuits associated with the IC wherein the IC connects to a further IC and said apparatus comprising:

a control switching circuit means included within the digital control section having a number of inputs and outputs, first and second inputs being connected to the TMS and TCK terminals and the outputs being connected to the controller, the control switching circuit means properly configuring TMS and TCK terminals as inputs to the controller for operating the interface to pass digital signals in a first instance and to pass analog signals in a second instance so as to operate the interface in both digital and analog modes;

a phase control counter circuit included within the digital control section having a number of inputs and a number of outputs, a first input being connected to the TDI terminal for receiving externally generated digital control signals during analog mode of operation for sequencing the phase control counter circuit through a number of states for producing signals defining predetermined phases of operation, a second input being connected to the control state machine and different ones of the outputs being connected to other inputs of the control switching circuit means; and analog control means having a number of inputs and a number of outputs, one of the inputs being connected to the TDI terminal, the remaining of the inputs being connected to the phase control counter circuit and to receive signals from the controller of the digital control section for operating in response to said instructions, the analog control means in response to the signals corresponding to a data bit pattern through the TDI terminal prior to analog activity, generating output signals to be used in transferring analog signals through the TCK and TMS terminals of IC for analog testing with the extended interface during the predetermined phases of operation.

12. The apparatus of claim 11 wherein the digital control section includes a plurality of standard registers connected to the controller and a direct register circuit, a multiplexer circuit having a number of inputs and an output connected to the TDO terminal of the IC, each register and direct register circuit having a serial input and a serial output, the serial input of each register and direct register circuit being connected to the TDI terminal and the serial output of each register and direct register circuit being connected to a different one of the multiplexer inputs, the controller of the digital control section generating signals for connecting the TDI terminal to the TDO terminal through the direct register circuit for directly transferring digital signals applied to the TDI terminal to the TDO terminal for controlling the sequencing of phases in the further IC.

13. The apparatus of claim 12 wherein the IC further includes a number of elements and wherein the analog control means further includes:

first analog switching circuit means connecting the TMS terminal to a first number of test and control points within the circuits of the IC for establishing at least one first circuit path;

second analog switching circuit means connecting the TCK terminal to a second number of test and control points within the circuits of the IC for establishing at least one second circuit path; and, decode control means connected to each of the first and second analog switching means; the decode control means when enabled by certain bits of the predetermined bit pattern, applying enabling signals for connecting predetermined ones of the analog switching circuit means to provide first and second circuit paths to selected ones of said test and control points for passing and monitoring analog signals for testing the elements connected to the test and control points.

14. The apparatus of claim 13 wherein the IC has a number of terminals used for interconnecting the IC to the further IC and wherein the number of elements are located external to the IC and connect to the number of terminals of said IC.

15. The apparatus of claim 12 wherein said analog control means further includes:

third analog switching circuit means connecting a number of voltage reference potential points to a third number of test and control points within the circuits for applying reference voltage potentials to the third number of test and control points when said interface is operating in said analog mode.

16. The apparatus of claim 12 wherein each of said first and analog switching means includes a number of analog switches and wherein one of the standard registers corresponds to an instruction register for storing instructions applied to said interface.

17. The apparatus of claim 15 wherein another one of the number of standard registers is an analog control register included within the analog control means for storing the predetermined data bit pattern loaded into said analog control register by the digital control section in response to decoding of a predetermined type of instruction, said data bit pattern being coded to specify connect and disconnect states for said number of analog switches in said first and second analog switching means for establishing said first and second circuit paths.

18. The apparatus of claim 16 wherein said number of said analog switches in said first and second analog switching means is related to the number of test and control points, said number of analog switches of said first and second analog switching means being arranged to form a matrix.

19. A method of extending the capability of a standard boundary scan interface of an integrated circuit (IC) to process both digital and analog signals, said interface having a digital data input (TDI) terminal, a digital data output (TDO) terminal, a test mode select (TMS) terminal, a test clock (TCK) terminal and a digital control section including a controller for defining a plurality of operational states for said interface and for generating control signals in response to instructions applied to the interface and a plurality of standard control registers connected to the controller and a direct register circuit, the control signals being used to control the boundary scan testing of circuits associated with the IC, the IC being serially connected to a further IC through the TDI and TDO terminals for testing and said method comprising:

(a) extending the interface by connecting a control switching circuit included within the digital control section between the controller and the TMS and TCK terminals for properly configuring TMS and TCK terminals as inputs to the controller for operating the interface to pass digital signals in a first instance and analog signals in a second instance so as to operate the interface in both digital and analog modes;

(b) further extending the interface by connecting a phase control counter circuit included within the digital control section to the TDI terminal to receive externally generated digital control signals during analog mode of operation for sequencing the phase control counter circuit through a number of states for producing signals defining predetermined phases of operation and to the control switching circuit for the configuring of the TMS and TCK terminals for operating the interface in either analog or digital mode according to the predetermined phases of operation; and, (c) connecting the TDI terminal to the TDO terminal through the direct register circuit in response to control signals from the controller for transferring the externally generated digital control signals applied to the TDI terminal to the TDO terminal of the further IC for controlling the sequencing of the predetermined phases of operation in the further IC.

20. A method of extending the capability of a standard boundary scan interface of an integrated circuit (IC) to process both digital and analog signals, the interface having a digital data input (TDI) terminal, a digital data output (TDO) terminal, a test mode select (TMS) input terminal, a test clock (TCK) terminal and a digital control section including a controller for defining a plurality of operational states for the interface and for generating in response to instructions applied to the interface, control signals used to control the testing of elements connected to test and control points of the IC, the IC being serially connected through the TDI and TDO terminals to a further IC for boundary scan testing, the method comprising:

(a) extending the interface by connecting control switching circuit means included within the digital control section between the controller and the TMS and TCK terminals for properly configuring TMS and TCK terminals as inputs to the controller for operating the interface in both analog and digital modes;

(b) next, extending the interface by connecting a phase control counter circuit included within the digital control section to the TDI terminal to receive externally generated digital control signals therefrom during analog mode of operation for sequencing the phase control counter circuit through a number of states for producing signals defining predetermined phases of operation and to the control switching circuit means for the configuring of the TMS and TCK terminals for operating the interface in either analog or digital mode based on the predetermined phases of operation;

(c) further extending the interface by connecting analog control means to the TDI terminal and to the phase control counter circuit for receiving digital control signals and the signals defining the predetermined phases of operation respectively therefrom;

(d) connecting the analog control means to the controller for operating in response to said instructions and a predetermined data bit pattern received through the TDI terminal prior to analog activity;

(e) connecting the TMS terminal to a first number of the test and control points of the IC through first analog switching circuit means included in the analog control means for extending the interface, for establishing at least one first circuit path;

(f) connecting the TCK terminal to a second number of the test and control points of the IC through second analog switching circuit means included in the analog control means for extending the interface, for establishing at least one second circuit path;

(g) connecting decode control means included within the analog control means included for extending the interface, to each of the first and second analog switching means; and, (h) the decode control means when enabled by certain bits of the predetermined data bit pattern applying enabling signals for connecting predetermined ones of the analog switching circuit means to provide first and second circuit paths to selected ones of said test and control points for passing and monitoring analog signals received from the TMS and TCK terminals for testing the elements connected to the test and control points.

21. The method of claim 20 wherein the IC has a number of terminals used for interconnecting the IC to the further IC, a number of the elements being located external to the IC and being connected to the number of terminals and wherein the further IC includes the extended interface for conducting analog testing of the elements located external to the IC.

* * * * *